(12) United States Patent  
Muller et al.

(10) Patent No.: US 8,102,033 B2
(45) Date of Patent: Jan. 24, 2012

(54) REDUCED SOFT ERROR RATE THROUGH METAL FILL AND PLACEMENT

(75) Inventors: K. Paul Muller, Wappingers Falls, NY (US); Alicia Wang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 174 days.

(21) Appl. No.: 12/473,435

(22) Filed: May 28, 2009

(65) Prior Publication Data

US 2010/0301463 A1    Dec. 2, 2010

(51) Int. Cl.
*H01L 23/556* (2006.01)

(52) U.S. Cl. ........ 257/659; 438/118; 438/622; 257/660; 257/758

(58) Field of Classification Search .................. 257/659, 257/E21.536, E23.115, 773, 660, 758; 438/761, 438/118, 622

See application file for complete search history.

(56) References Cited

U.S. PATENT DOCUMENTS

| 4,849,804 | A | 7/1989 | Mader |
| 5,576,225 | A | 11/1996 | Zhang et al. |
| 5,972,742 | A | 10/1999 | Zhang et al. |
| 7,176,490 | B2 | 2/2007 | Isobe et al. |
| 7,234,121 | B2 * | 6/2007 | Zhu et al. ...................... 716/122 |
| 7,250,363 | B2 | 7/2007 | Landis et al. |
| 7,278,076 | B2 | 10/2007 | Zhang et al. |
| 7,381,635 | B2 | 6/2008 | Cabral, Jr. et al. |

* cited by examiner

*Primary Examiner* — Roy Potter
(74) *Attorney, Agent, or Firm* — Cantor Colburn LLP; William A. Kinnaman, Jr.

(57) ABSTRACT

A method for reducing single event upsets in an integrated circuit includes the step of providing a plurality of levels within the integrated circuit, wherein the plurality of levels within the integrated circuit are in a stacked arrangement. The method also includes the step of providing a plurality of metal fill patterns within each of the plurality of levels within the integrated circuit. The method further includes the step of placing the plurality of metal fill patterns within at least one of the plurality of levels in a pattern such that a line of sight towards an active silicon layer does not exist within the stacked arrangement of the plurality of levels, thereby increasingly absorbing ionizing radiation particles, and thereby reducing single event upsets in the integrated circuit.

25 Claims, 5 Drawing Sheets

REDUCED SOFT ERROR RATE THROUGH METAL FILL AND PLACEMENT

The present invention relates to integrated circuits, and, more specifically, to reducing the soft error rate (SER) in integrated circuits.

As integrated circuit (IC) manufacturing technology continues to achieve ICs that are scaled downward in size, the probability of relatively highly energetic ionizing radiation particles reaching transistors formed as part of the IC increases. These particles may comprise cosmic neutrons or alpha particles emitted from solder bumps or C4s (controlled collapse chip connections) or from packaging materials such as ceramics. The energetic particle may have sufficient energy to penetrate into the active device silicon layer and generate or deposit a charge within the body or channel of a transistor device formed in a bulk or in a silicon-on-insulator (SOI) technology. This charge can turn a transistor "on" for a short period of time, where that transistor was previously turned "off." This momentarily disrupts proper operation of the transistor and the circuit (e.g., latch, SRAM/DRAM cells) that the transistor is a part of (i.e., the logic circuit latch or memory cell may undesirably change its stored binary state). This type of soft error event is typically referred to as a single event upset (SEU).

Various techniques are known to attempt to mitigate these soft errors. These include physically shielding the entire IC device from radiation through use of, e.g., a blocking layer as part of the IC. Also, logical techniques have been employed. For example, at a register level, parity bits are added to stored data and error correction codes are used to check for corrupted data. At the latch level, in which only a single bit of information is typically stored, three latches can be used to represent the same data and a one out of three majority circuit is used to read the data (i.e., ab+ac+bc). At the transistor level, redundant transistors/storage nodes may be employed and compared against one another. These techniques, however, can be expensive to employ, in terms of area utilized on an IC, delay and/or power consumption.

BRIEF SUMMARY

According to an embodiment of the invention, a method for reducing single event upsets in an integrated circuit includes the step of providing a plurality of levels within the integrated circuit, wherein the plurality of levels within the integrated circuit are in a stacked arrangement. The method also includes the step of providing a plurality of metal fill patterns within each of the plurality of levels within the integrated circuit. The method further includes the step of placing the plurality of metal fill patterns within at least one of the plurality of levels in a pattern such that a line of sight towards an active silicon layer does not exist through the stacked arrangement of the plurality of levels, thereby increasingly absorbing ionizing radiation particles, and thereby reducing single event upsets in the integrated circuit.

According to another embodiment of the invention, an integrated circuit includes a plurality of levels in a stacked arrangement. The integrated circuit also includes a plurality of metal fill patterns within each of the plurality of levels, wherein the plurality of metal fill patterns within at least one of the plurality of levels are arranged in a manner such that a line of sight does not exist within the stacked arrangement of the plurality of levels, thereby increasingly absorbing ionizing radiation particles, and thereby reducing single event upsets in the integrated circuit.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages of the invention are apparent from the following detailed description in conjunction with the accompanying drawings in which:

DETAILED DESCRIPTION

Figure 1:
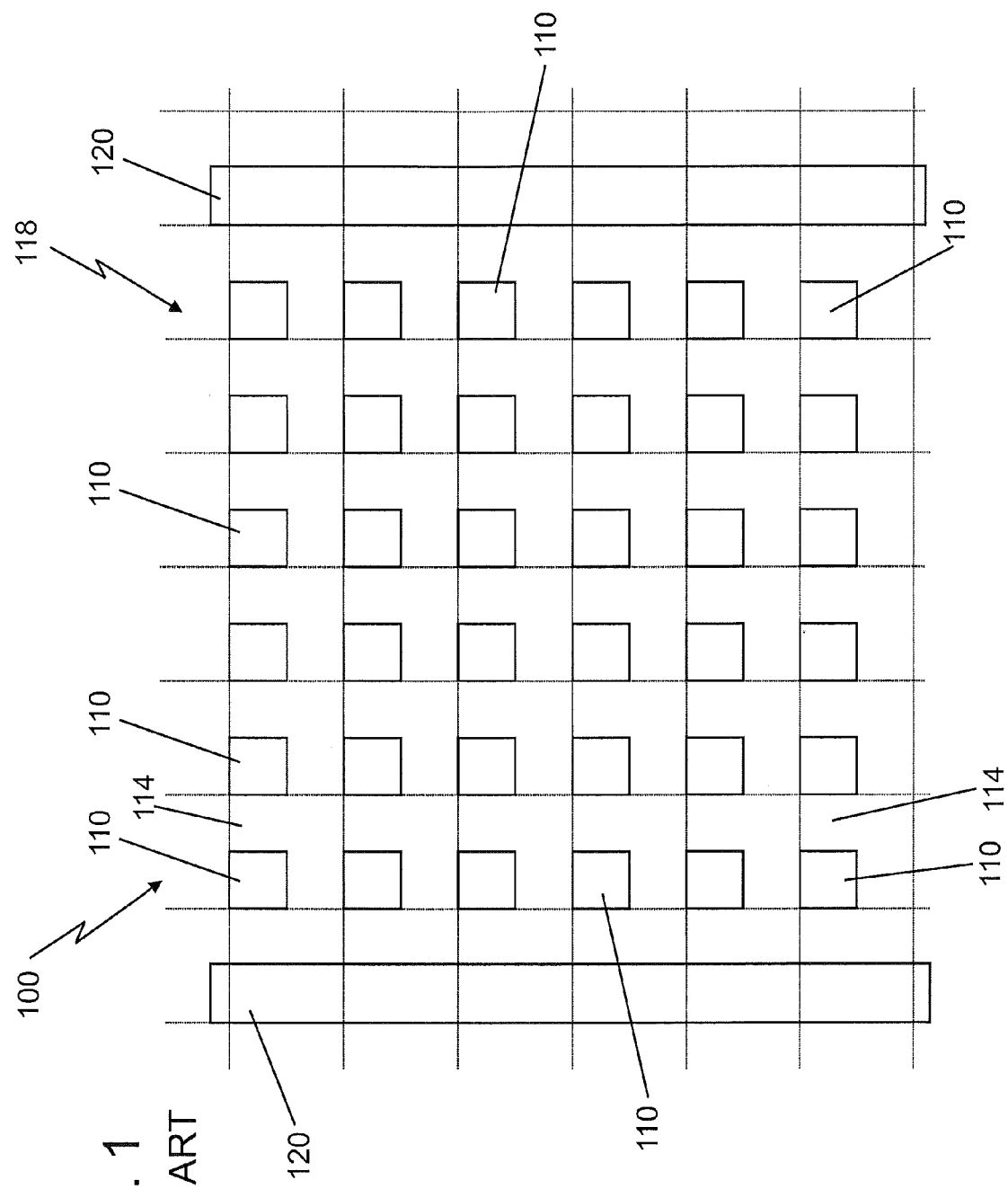
FIG. 1 is a top view of an embodiment of a metal level within an IC with approximately 25% metal fill content in the prior art.
Figure 2:
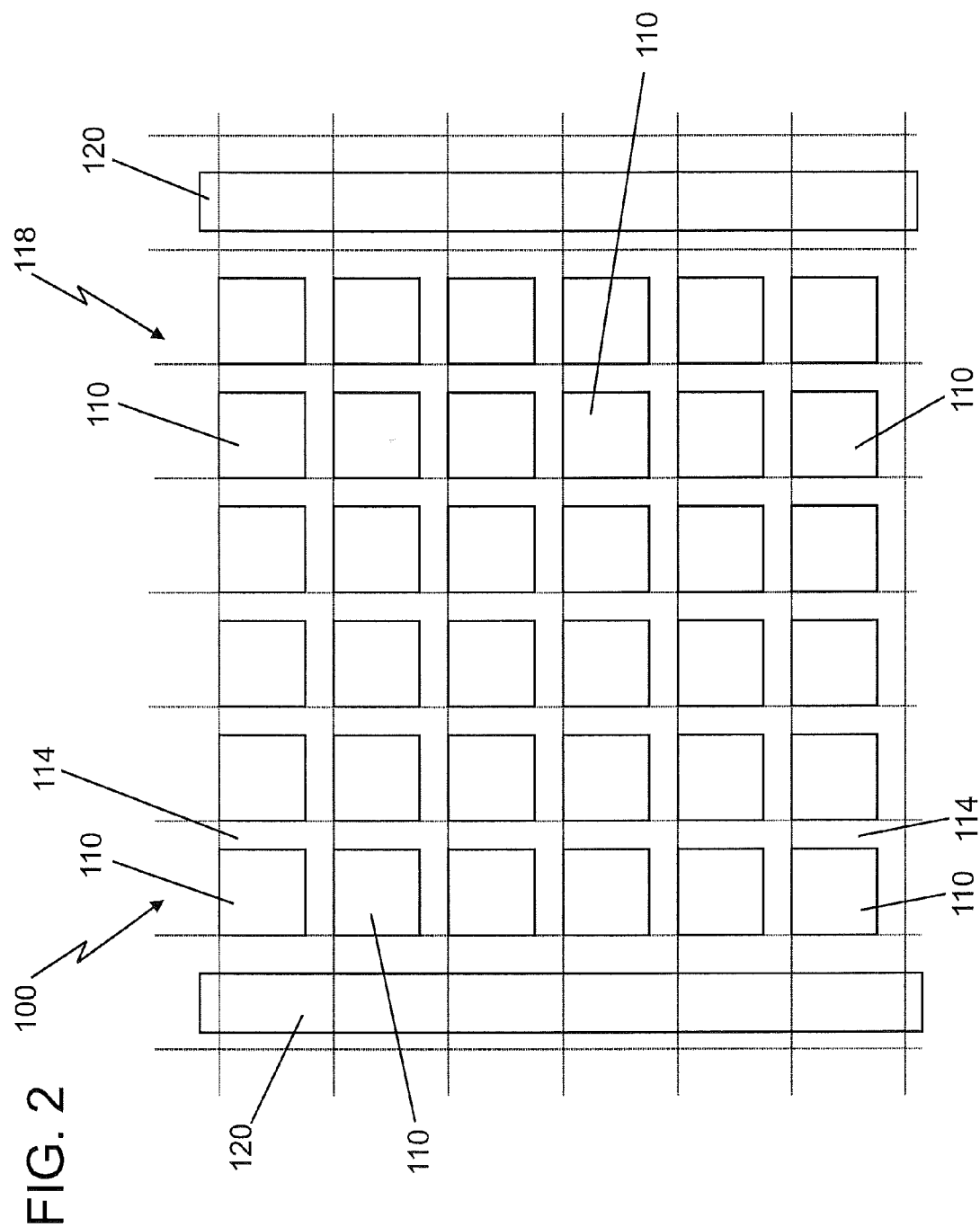
FIG. 2 is a top view of an embodiment of a metal level layer within an IC with approximately 60% metal fill content.
Figure 3:
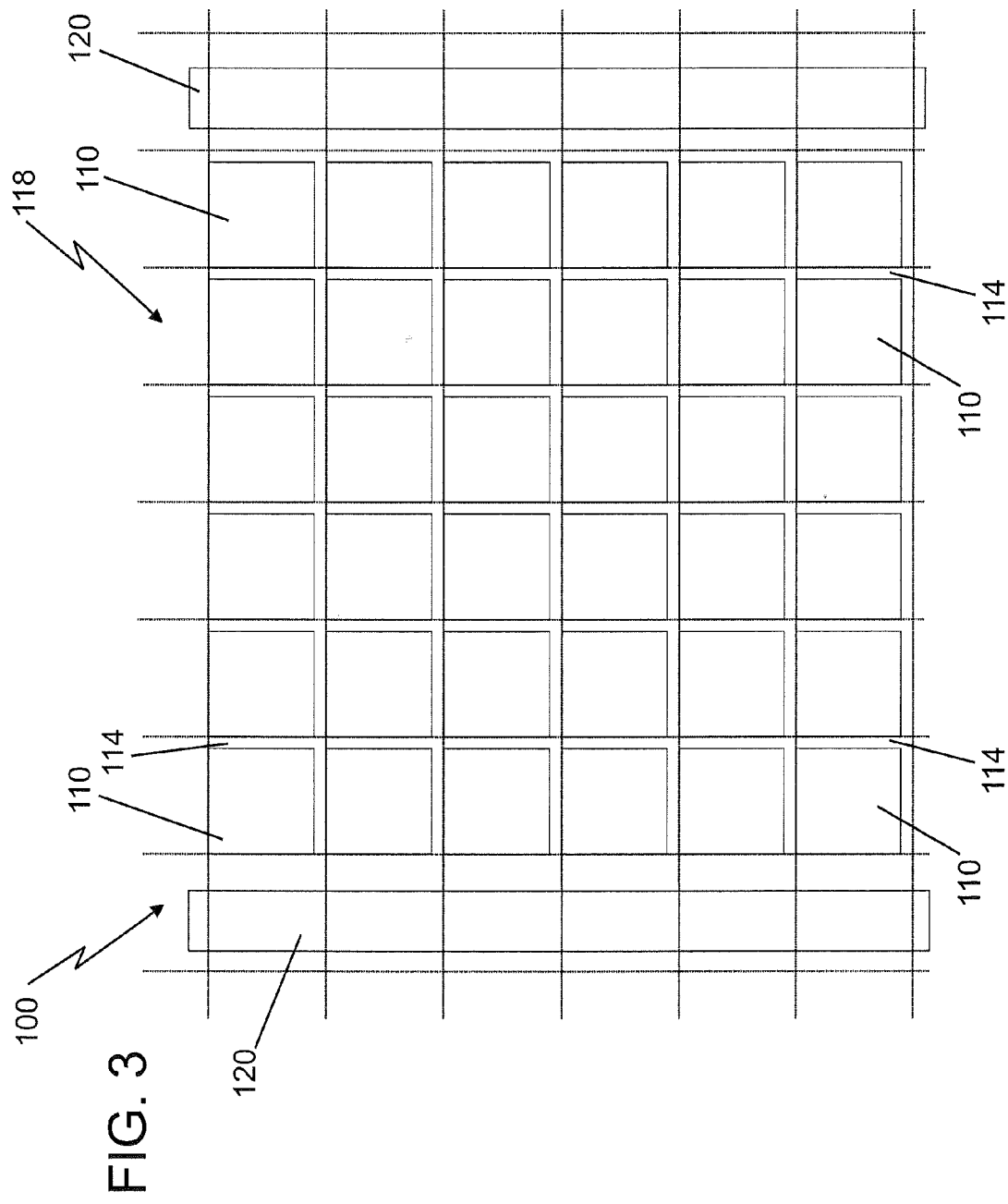
FIG. 3 is a top view of an embodiment of a metal level within an IC with approximately 80% metal fill content.

Referring to FIG. 1, there illustrated is an embodiment of a metal level 100 within an IC with approximately 25% metal fill content with respect to the overall surface area of the entire metal level 100 in the prior art. FIGS. 2 and 3 illustrate embodiments according to the invention of a metal layer 100 within an IC with approximately 60% and 80% metal fill content, respectively. The metal fill in the embodiments of FIGS. 1-3 may comprise patterns in the form of, e.g., squares 110, although other suitable shapes for the metal fill patterns 110 may be utilized. Each metal fill pattern or square 110 may comprise a portion of the surface area of a corresponding larger square 114 with the larger squares 114 being arranged in a grid 118. Thus, a metal fill content of 25% is similar to every square 114 having a metal fill surface area of 25%, the metal fill surface area also being in the form of a square 110. In FIGS. 1-3, the squares 110 are flanked on each side by a continuous metal line 120 that may comprise a signal wire, or a power supply line (Vdd or Gnd) as part of the electrically active circuitry.

The semiconductor IC manufacturing industry typically utilizes a back-end-of-line (BEOL) metal fill process step in order to ease the chemical mechanical polishing (CMP) process. During the process-of-record (POR) fill routine, a metal fill algorithm may generate "dummy" metal fill patterns, for example, the squares 110 of FIGS. 1-3, which are included in each of the metal levels or layers 100 of the IC design. Modern ICs typically have approximately ten or more levels 100 of metal. The metal fill patterns 110 are not part of the actual design of the IC, but simply fill empty space within the IC with a typically uniform metal fill pattern (e.g., squares) that take up a certain percentage of the overall surface area of the corresponding metal level 100, although a non-uniform metal fill pattern may be utilized. Typical metal fill densities can range from 20% to 80%, with an average of approximately 50%.

Figure 4:
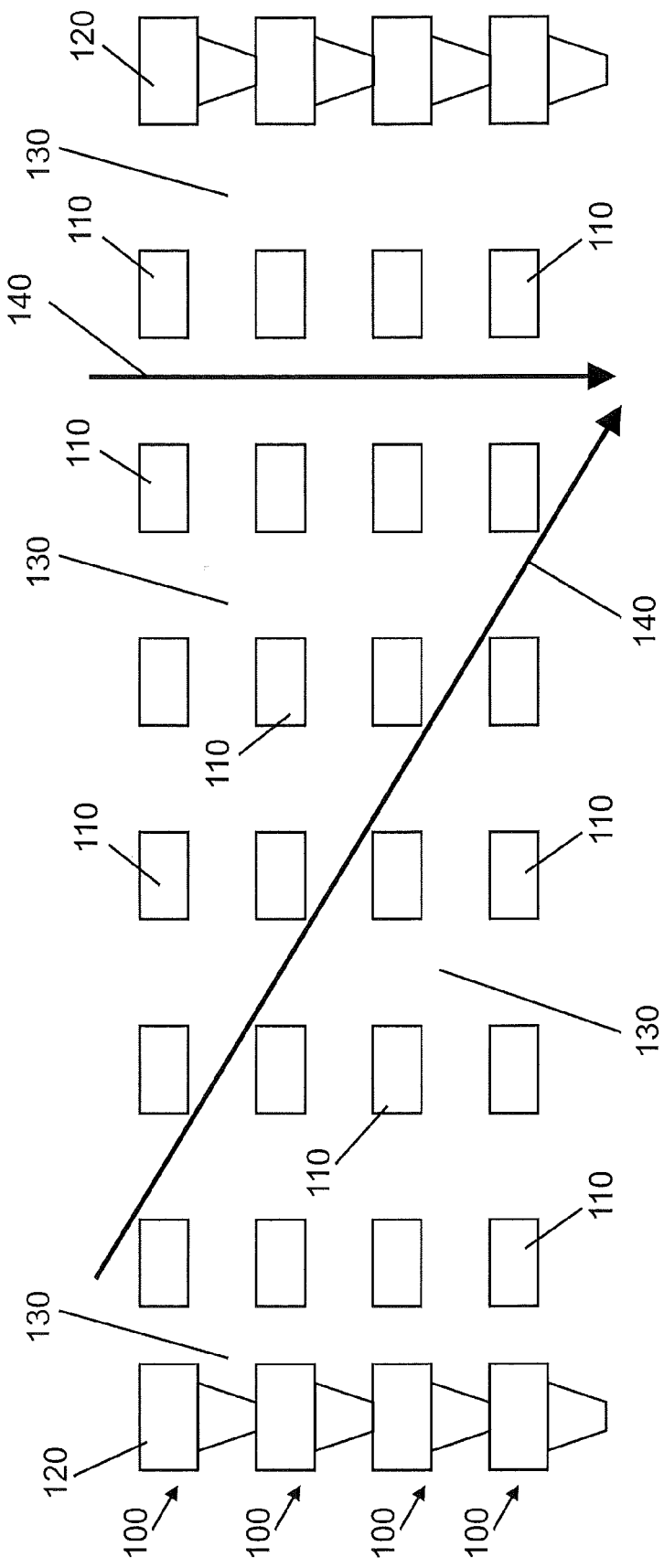
FIG. 4 is a cross section view of several levels of metal in a first alignment thereof within a portion of an IC in the prior art.
Figure 5:
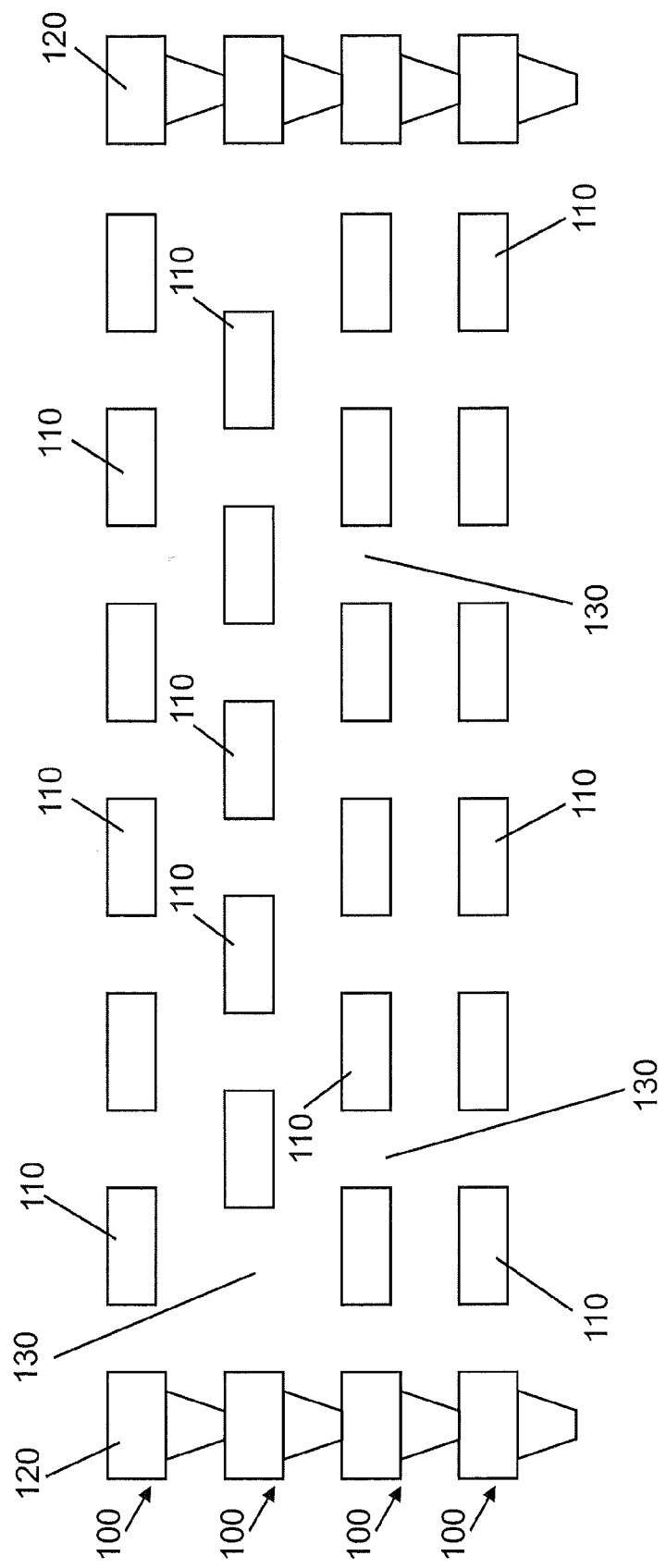
FIG. 5 is a cross section view of several levels of metal in a second alignment thereof within a portion of an IC.

However, a greater amount of surface area metal within the metal level 100 equates to a larger amount of metal that can potentially absorb the highly energetic ionizing radiation particles. Thus, a 50% metal fill rate may not be large enough to adequately absorb the ionizing radiation particles. In general, a higher percentage of metal is beneficial for SER mitigation, as the ionizing particle stopping power of a metal (e.g., copper) is higher than the stopping power of a dielectric (e.g., silicon dioxide), which is commonly used in an IC design, for example, in between the metal squares 110 and also in between metal levels 100 stacked on top of each other (FIGS. 4-5). However, other metals besides copper may be used that are suitable for stopping ionizing radiation particles. According to embodiments of the invention, by increasing the amount of metal fill in the squares 110 (such as the 80% fill squares 110 in FIG. 3 as compared to the 25% fill squares 110 in FIG. 1 in the prior art), the number of undesirable SEUs that may occur within the IC is decreased, thereby decreasing the overall SER of the IC. Embodiments of the invention are not limited to an 80% maximum fill rate; other fill rates greater than or less than 80% are possible.

Referring to FIG. 4, as mentioned, modern ICs typically have approximately ten or more levels 100 of metal. Even with this relatively large number of metal levels 100, there can be instances where the metal fill patterns 110 are arranged in a pattern that results in a "line of sight" through openings between the metal fill patterns 110 and through the oxide 130 that is typically used within an IC as an insulator. FIG. 4 illustrates in cross section four levels 100 of metal stacked on top of each other, as in the prior art. The lines with arrowheads 140 each depicts the line of sight through the entire stack of metal levels 100 in FIG. 4. Such a "line of sight" through the entire stack of metal levels 100 is undesirable, since it may lead to a path exclusively through oxide, and not through the better absorbing metal. Particles going through such a path will reach the active silicon (e.g., transistors—not shown) in higher numbers and/or with higher energy.

FIG. 5 is similar to FIG. 4 in that it illustrates in cross section several levels 100 of metal fill patterns 110 in a pattern or arrangement. However, the alignment of the metal fill patterns 110 of FIG. 5 results in a pattern of strategically placed metal fill patterns 110 that eliminate the clear line of sight or path through the metal levels 100 and the oxide 130 and on to the active (silicon) device layer. This results in a reduction or even an elimination in the ability of a highly energetic particle to reach the active device layer and cause an SEU, which has the beneficial effect of reducing the SER of the overall IC. In FIG. 5, the strategically placed metal fill patterns 110 involves those of the second metal level 100 from the top being offset from metal fill patterns 110 of the other metal levels 100 within the portion of the IC of FIG. 5. However, suitable strategic placements of the metal fill patterns 110 within each metal level 100 other than an offset of a single level 100 may be utilized, in accordance with the teachings herein.

The metal fill patterns 110 may be formed during the BEOL process step, or may be formed during some other step in the IC manufacturing process. Also, by forming the metal fill patterns 110 during the BEOL process step, the benefits of the CMP process steps are not reduced.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method for reducing single event upsets in an integrated circuit, comprising:
    providing a plurality of levels within the integrated circuit, wherein the plurality of levels within the integrated circuit are in a stacked arrangement;
    providing a plurality of metal fill patterns within each of the plurality of levels within the integrated circuit; and
    placing the plurality of metal fill patterns within at least one of the plurality of levels in a pattern such that a line of sight towards an active silicon layer does not exist through the stacked arrangement of the plurality of levels, thereby increasingly absorbing ionizing radiation particles, and thereby reducing single event upsets in the integrated circuit.

2. The method of claim 1, wherein at least some of the plurality of metal fill patterns comprise one of a number of shapes.

3. The method of claim 2, wherein at least one of the shapes comprises a square.

4. The method of claim 1, wherein the metal comprises copper.

5. The method of claim 1, wherein the plurality of metal fill patterns in at least one of the plurality of levels are arranged in a uniform pattern.

6. The method of claim 1, wherein at least some of the plurality of metal fill patterns comprise copper.

7. The method of claim 1, wherein placing the plurality of metal fill patterns within at least one of the plurality of levels in a pattern such that a line of sight does not exist through the stacked arrangement of the plurality of levels comprises offsetting at least one of the plurality of levels with respect to other ones of the plurality of levels such that the pattern of the plurality of metal fill patterns within the offset level is offset from the pattern of the plurality of metal fill patterns from the other ones of the plurality of levels, such that a line of sight does not exist within the stacked arrangement of the plurality of levels.

8. The method of claim 1, wherein the plurality of metal fill patterns within each of the plurality of levels within the integrated circuit comprise a surface area of greater than 50% with respect to an overall surface area of the corresponding level.

9. The method of claim 8, wherein the surface area of the plurality of metal fill patterns in at least one of the plurality of levels is approximately 80% with respect to the overall surface area of the at least one of the plurality of levels.

10. A method for preventing ionizing radiation particles from causing a single event upset in an integrated circuit, comprising:
providing a plurality of levels in a stacked arrangement within the integrated circuit;
providing a plurality of metal fill patterns within each of the plurality of levels within the integrated circuit; and
placing the plurality of metal fill patterns within at least one of the plurality of levels in a pattern such that a line of sight does not exist within the stacked arrangement of the plurality of levels, thereby increasingly absorbing the ionizing radiation particles, and thereby preventing the single event upset in the integrated circuit.

11. The method of claim 10, wherein at least some of the plurality of metal fill patterns comprise squares.

12. The method of claim 10, wherein the plurality of metal fill patterns comprise copper.

13. The method of claim 10, wherein the plurality of metal fill patterns in at least one of the plurality of levels are arranged in a uniform pattern.

14. The method of claim 10, wherein providing the plurality of metal fill patterns within each of the plurality of levels within the integrated circuit occurs during a back-end-of-line step during manufacturing of the integrated circuit.

15. The method of claim 10, wherein placing the plurality of metal fill patterns within at least one of the plurality of levels in a pattern such that a line of sight does not exist within the stacked arrangement of the plurality of levels comprises offsetting at least one of the plurality of levels with respect to the other ones of the plurality of levels such that the pattern of the plurality of metal fill patterns within the offset level is offset from the pattern of the plurality of metal fill patterns from the other ones of the plurality of levels, such that a line of sight does not exist within the stacked arrangement of the plurality of levels.

16. The method of claim 10, wherein each of plurality of metal fill patterns within each of the plurality of levels within the integrated circuit comprises a surface area of greater than 50% with respect to an overall surface area of the corresponding level.

17. The method of claim 16, wherein the surface area of each of the plurality of metal fill patterns in at least one of the plurality of levels is approximately 80% with respect to the overall surface area of the at least one of the plurality of levels.

18. An integrated circuit, comprising:
a plurality of levels in a stacked arrangement; and
a plurality of metal fill patterns within each of the plurality of levels, wherein the plurality of metal fill patterns within at least one of the plurality of levels are arranged in a manner such that a line of sight does not exist within the stacked arrangement of the plurality of levels, thereby increasingly absorbing ionizing radiation particles, and thereby reducing single event upsets in the integrated circuit.

19. The integrated circuit of claim 18, wherein at least some of the plurality of metal fill patterns comprise squares.

20. The integrated circuit of claim 18, wherein the plurality of metal fill patterns in at least one of the plurality of levels are arranged in a uniform pattern.

21. The integrated circuit of claim 18, wherein the metal of the metal fill patterns comprises copper.

22. The integrated circuit of claim 18, wherein the plurality of metal fill patterns within at least one of the plurality of levels are arranged in the pattern that comprises at least one of the plurality of levels being offset with respect to the other ones of the plurality of levels, such that a line of sight does not exist within the stacked arrangement of the plurality of levels.

23. A method, comprising:
providing a plurality of levels within an integrated circuit, wherein the plurality of levels within the integrated circuit are in a stacked arrangement; and
providing a plurality of square metal fill patterns within each of the plurality of levels within the integrated circuit, wherein the plurality of square metal fill patterns within each of the plurality of levels within the integrated circuit comprises a surface area of greater than 50% with respect to an overall surface area of the corresponding level.

24. The method of claim 23, wherein the surface area of the plurality of square metal fill patterns in at least one of the plurality of levels is approximately 80% with respect to the overall surface area of the at least one of the plurality of levels.

25. The method of claim 23, further comprising placing the plurality of square metal fill patterns within at least one of the plurality of levels in a pattern such that a line of sight does not exist within the stacked arrangement of the plurality of levels.

* * * * *